United States Patent
Lee (10) Patent No.: US 11,476,084 B2
(45) Date of Patent: Oct. 18, 2022

(54) APPARATUS AND TECHNIQUES FOR ION ENERGY MEASUREMENT IN PULSED ION BEAMS

(71) Applicant: APPLIED Materials, Inc., Santa Clara, CA (US)

(72) Inventor: W. Davis Lee, Rockport, ME (US)

(73) Assignee: APPLIED Materials, Inc., Santa Clara, CA (US)

(*) Notice: Subject to any disclaimer, the term of this patent is extended or adjusted under 35 U.S.C. 154(b) by 537 days.

(21) Appl. No.: 16/566,249

(22) Filed: Sep. 10, 2019

(65) Prior Publication Data

US 2021/0074508 A1     Mar. 11, 2021

(51) Int. Cl.
H01J 37/244 (2006.01)
H01J 37/317 (2006.01)

(52) U.S. Cl.
CPC ......... *H01J 37/244* (2013.01); *H01J 37/3171* (2013.01); *H01J 2237/0473* (2013.01); *H01J 2237/24585* (2013.01)

(58) Field of Classification Search
CPC ............ H01J 37/244; H01J 37/3171; H01J 2237/0473; H01J 2237/24585; H01J 2237/24514
See application file for complete search history.

(56) References Cited

U.S. PATENT DOCUMENTS

| | | | | |
|---|---|---|---|---|
| 6,137,112 A * | 10/2000 | McIntyre | ............ | H01J 37/304 250/287 |
| 10,283,422 B2 | 5/2019 | Kariya et al. | | |
| 2004/0056210 A1 | 3/2004 | Scherer | | |
| 2006/0097195 A1 | 5/2006 | Angel et al. | | |
| 2006/0219955 A1 | 10/2006 | Ray | | |
| 2014/0028220 A1 * | 1/2014 | Bromberg | ............ | H05H 7/02 315/502 |
| 2015/0280611 A1 * | 10/2015 | Kusumoto | ............ | H01L 29/7802 257/77 |
| 2018/0350556 A1 * | 12/2018 | Bleiner | ............ | G01R 15/181 |

(Continued)

FOREIGN PATENT DOCUMENTS

| | | |
|---|---|---|
| JP | 2018-085179 A | 5/2018 |
| TW | 200943366 A | 10/2009 |
| TW | 201129795 A | 9/2011 |

OTHER PUBLICATIONS

Flavio et al. "Current distribution measurements inside an electromagnetic plasma gun operated in a gas-puff mode", Physics of Plasmas 17, 2010, p. 123508-1-123508-11. (Year: 2010).*

(Continued)

*Primary Examiner* — David P Porta
*Assistant Examiner* — Mamadou Faye
(74) *Attorney, Agent, or Firm* — KDB Firm PLLC (57) ABSTRACT

An apparatus may include a first beam sensor, disposed adjacent a first position along a beamline. The apparatus may further include a second beam sensor, disposed adjacent a second position along the beamline, at a predetermined distance, downstream of the first beam sensor. The apparatus may include a detection system, coupled to the first beam sensor and to the second beam sensor to receive from a pulsed ion beam a first electrical signal from the first beam sensor and a second electrical signal from the second beam sensor.

14 Claims, 7 Drawing Sheets

(56) References Cited

U.S. PATENT DOCUMENTS

2019/0157063 A1   5/2019 Jaeschke et al.
2021/0076482 A1*  3/2021 Sakurai .................. H05H 9/04

OTHER PUBLICATIONS

International Search Report and Written Opinion dated Nov. 13, 2020, for the International Patent Application No. PCT/US2020/045212, filed on Aug. 6, 2020, 3 pages.
Written Opinion dated Nov. 13, 2020, for the International Patent Application No. PCT/US2020/045212, filed on Aug. 6, 2020, 7 pages.

* cited by examiner

APPARATUS AND TECHNIQUES FOR ION ENERGY MEASUREMENT IN PULSED ION BEAMS

FIELD OF THE DISCLOSURE

The disclosure relates generally to charged particle energy measurement and in particular to energy measurement of pulsed ion beams.

BACKGROUND OF THE DISCLOSURE

Ion beams are employed for many types of processing, including ion implantation, a process of introducing dopants or impurities into a substrate via bombardment. Ion implantation systems may comprise an ion source and a series of beam-line components. The ion source may comprise a chamber where ions are generated. The beam-line components, may include, for example, a mass analyzer, a collimator, and various components to accelerate or decelerate the ion beam. Much like a series of optical lenses for manipulating a light beam, the beam-line components can filter, focus, and manipulate an ion beam having particular species, shape, energy, and/or other qualities. The ion beam passes through the beam-line components and may be directed toward a substrate mounted on a platen or clamp. The final beam energy of the ion beam helps determine the depth to which ions are implanted in a substrate, such as a semiconductor substrate or device, and thus to control the properties of the substrate or device.

High energy ion implantation may involve the use of tandem accelerators or a linear accelerator, or LINAC, where a series of electrodes arranged as tubes around the beam accelerate the ion beam to increasingly higher energy along the succession of tubes. The various electrodes may be arranged in a series of stages where a given electrode in a given stage receives an AC voltage signal to accelerate the ion beam.

LINACs employ initial stages for bunching an ion beam as the beam is conducted through the beamline. An initial stage of a LINAC may be referred to as a buncher, where a continuous ion beam is received by the buncher and is output as a bunched ion beam in packets, or ion beam pulses. The ion beam pulses may be accelerated through a series of stages to higher and higher energy, where final beam energy may be in the range of several hundred keV to 10 MeV or greater. Ideally, for greater control of device properties, a monoenergetic ion beam may be used to implant into the substrate. Notably, a challenge is to accurately measure the beam energy in an implanter, while not perturbing the ion beam in doing so.

With respect to these and other considerations, the present disclosure is provided.

BRIEF SUMMARY

In one embodiment, an apparatus is provided. The apparatus may include a first beam sensor, disposed adjacent a first position along a beamline. The apparatus may further include a second beam sensor, disposed adjacent a second position along the beamline, at a predetermined distance, downstream of the first beam sensor. The apparatus may include a detection system, coupled to the first beam sensor and to the second beam sensor to receive from a pulsed ion beam a first electrical signal from the first beam sensor and a second electrical signal from the second beam sensor.

In another embodiment, a system is provided, including an ion source to generate an ion beam, and a buncher to receive the ion beam as a continuous beam and output a pulsed ion beam along a beamline, the pulsed ion beam comprising a plurality of pulses. The system may include a beam energy measurement apparatus, disposed downstream of the buncher. The beam energy measurement apparatus may include a first Rogowski coil, disposed concentrically with respect to the beamline, and a second Rogowski coil, arranged at a predetermined distance, downstream of the first Rogowski coil, and disposed concentrically with respect to the beamline. The beam measurement apparatus may also include a detection system, coupled to the first Rogowski coil and to the second Rogowski coil, to receive from the pulsed ion beam a first electrical signal from the first Rogowski coil and a second electrical signal from the second Rogowski coil. As such, the detection system may be arranged to compare a timing of the first electrical signal and the second electrical signal.

In a further embodiment, a method may include receiving a pulse of a pulsed ion beam through a first space at a first position along a beamline at a first instance and generating a first sensor signal in a first beam sensor, disposed at the first position, based upon the pulse. The method may include receiving the pulse in a second space at a second position along the beamline, disposed downstream of the first position, at a second instance. The method may also include generating a second sensor signal in a second sensor, disposed at the second position, based upon the pulse, and determining an ion energy of the pulse based upon an elapsed time between the first instance and the second instance.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for beam energy measurement. The embodiments disclosed herein are suitable for beam energy measurement for pulsed ion beams. In various non-limiting embodiments, apparatus, systems, and methods may be used for measurement of ion beams in high energy implantation systems, while the approaches may be suitable for ion beams of any energy.

Figure 1:
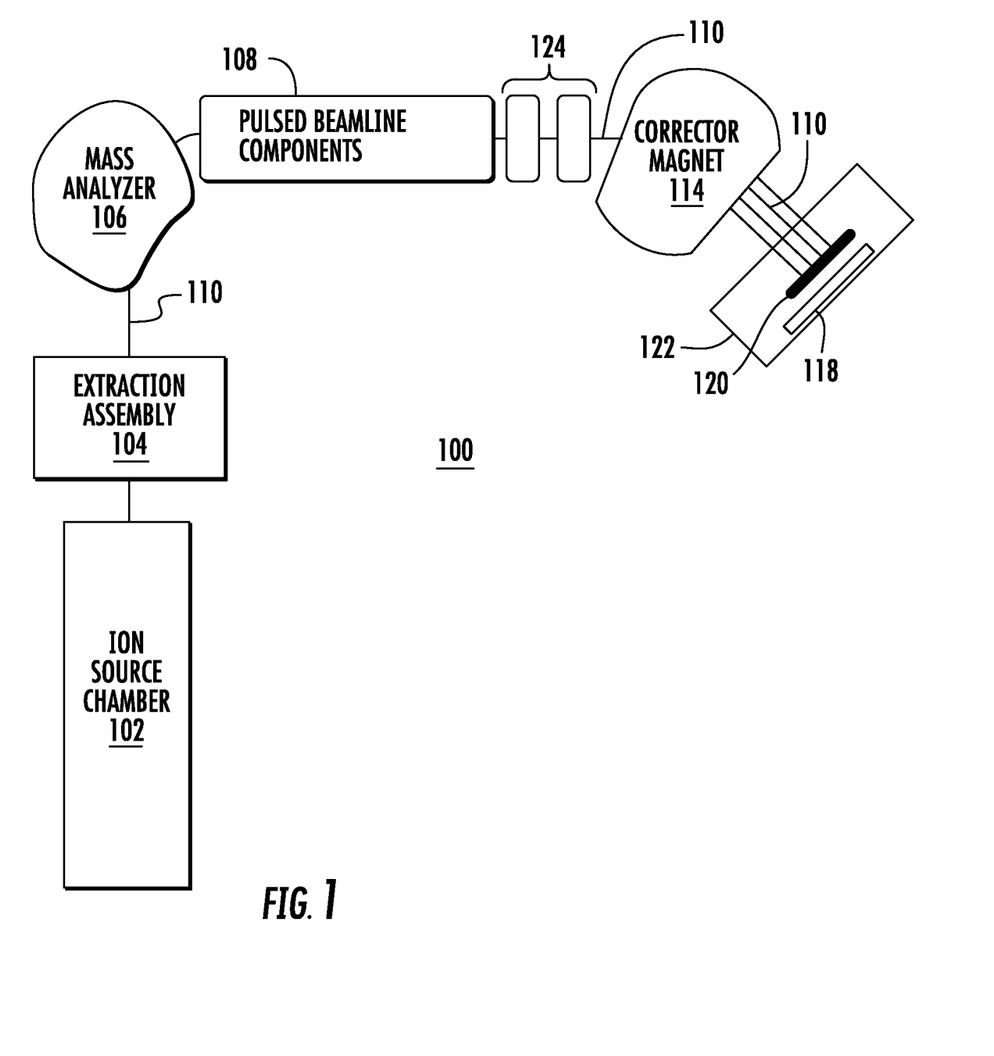
FIG. 1 shows an exemplary ion implantation system, according to embodiments of the disclosure.

Referring now to FIG. 1, an exemplary ion implanter, shown as implantation system 100, is depicted in block form. The ion implantation system 100 may represent a beamline ion implanter, with some elements omitted for clarity of explanation. The ion implantation system 100 may include an ion source 102, The ion source 102 may include extraction components, including an extraction assembly 104, and filters (not shown) to generate an ion beam 110 at a first energy. Examples of suitable ion energy for the first ion energy range from 5 keV to 100 keV, while the embodiments are not limited in this context. To form a pulsed ion beam, the ion implantation system 100 includes various additional components, shown as pulsed beamline components 108.

The ion implantation system 100 may include an analyzer 106, functioning to analyze a received ion beam. Thus, in some embodiments, the analyzer 106 may receive the ion beam 110 with an energy imparted by extraction assembly 104 located at the ion source 102, where the ion energy is in the range of 100 keV or below.

The pulsed beamline components 108 may also include a buncher, and a linear accelerator (not separately shown), disposed downstream of the buncher. The operation of a buncher is detailed below. In brief, a buncher is disposed downstream of the ion source 102, to accept the ion beam 110 as a continuous ion beam (or DC ion beam), and to output the beam as a bunched ion beam. In a bunched ion beam the ion beam is output as a pulsed ion beam in discrete packets or pulses. These pulses may be subject to manipulation, such as acceleration in stages of a linear accelerator.

In various embodiments, the ion implantation system 100 may include additional known components, such as a corrector magnet/collimator 114, which component is well known and will not be described herein in further detail. As such, the ion beam 110 may be delivered in pulses to an end station 122 for processing a substrate 120, disposed on a substrate stage 118.

As further shown in FIG. 1, the ion implantation system 100 may include a beam energy measurement apparatus 124, where the operation is detailed in embodiments to follow. In brief, the beam energy measurement apparatus 124, and variants of the beam energy measurement apparatus 124, include components to measure beam energy of the ion beam 110, while not directly coming into contact with the ion beam 110, and not perturbing the ion beam 110. These components are suitable for measuring the beam energy of ion beam 110 at any suitable location along the beamline of the ion implantation system 100 where the ion beam 110 is conducted as a pulsed ion beam.

Figure 2:
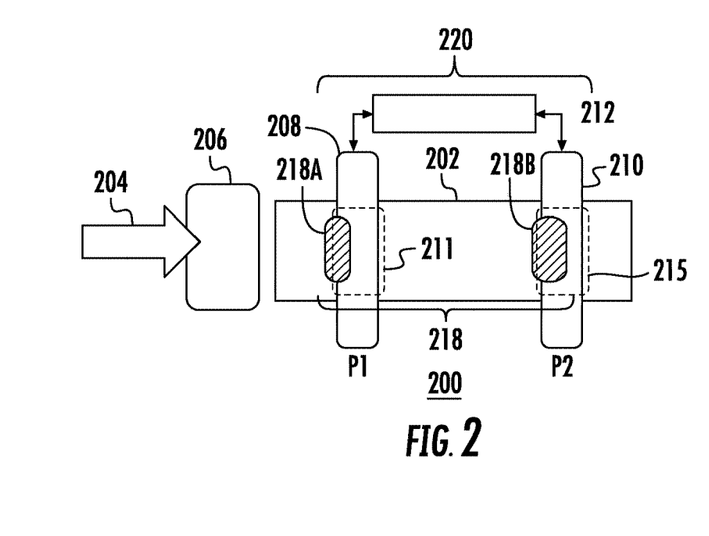
FIG. 2 depicts an exemplary apparatus for measuring beam energy according to embodiments of the disclosure.

FIG. 2 depicts an exemplary apparatus, shown as apparatus 200, according to embodiments of the disclosure. The apparatus 200 includes a vacuum chamber 202 to conduct an ion beam, and forming part of a beamline of an ion implanter. The apparatus 200 further includes a buncher 206 to receive an ion beam 204, where the ion beam 204 may represent a continuous ion beam. The buncher 206 may include known components as known in the art, to output the ion beam 104 as a pulsed ion beam. For example, the buncher may employ an RF voltage source to generate pulses with a frequency in the range of 13 MHz to 40 MHz in some embodiments. In some embodiments, the buncher 206 may be supplemented with additional stages (downstream) of a linear accelerator to accelerate the pulsed ion beam, as known in the art. Thus, in the scenario of FIG. 2, the ion beam 204 enters the vacuum chamber 202 as a pulsed ion beam, shown as ion beam pulse 218A.

As further depicted in FIG. 2, the apparatus 200 includes a beam energy measurement apparatus 220, including a first beam sensor 208, disposed at a first position along the beamline, meaning the first beam sensor 208 is disposed adjacent a space where the ion beam is conducted through the vacuum chamber 202 of the beamline at position P1. The beam energy measurement apparatus 220 further includes a second beam sensor 210, arranged at a second position, shown as position P2, at a predetermined distance, downstream of the first position. As such, ion beam pulses of the ion beam 204 are conducted through regions of the vacuum chamber 202 near the first beam sensor 208 and the second beam sensor 210.

The beam energy measurement apparatus 220 also includes a detection system 212, coupled to the first beam sensor 208 and to the second beam sensor 210. The detection system 212 includes components to receive a first electrical signal from the first beam sensor 208 and a second electrical signal from the second beam sensor 210. More particularly, when the ion beam pulse 218A passes by the space 211 defined by the first beam sensor 208, the first beam sensor 208 may generate a first sensor signal to be received by the detection system 212. The first sensor signal may be a first sensor voltage signal, for example. When the ion beam pulse 218A propagates down the beamline as ion beam pulse 218B and passes by the space 215 defined at position P2 by the second beam sensor 210, the second beam sensor 210 may generate a second sensor signal to be received by the detection system 212. The second sensor signal may be a second sensor voltage signal, for example. As detailed below with respect to FIG. 5A and FIG. 5B, the detection system 212 may determine beam energy of the pulsed ion 218 beam based upon the timing of signals generated by the first beam sensor 208 and the second beam sensor 210.

According to various embodiments, the first beam sensor 208 and the second beam sensor 210 may be any combination of Rogowski coil, inductive pickup, or capacitive pickup. In an example of a capacitive pickup, a metallic cylinder may be arranged to be electrically floating at the position P1, or alternatively or in addition at the position P2. The capacitive pickup would then measure a voltage change as a beam pulse passes through the beamline at position P1 or position P2.

Figure 3:
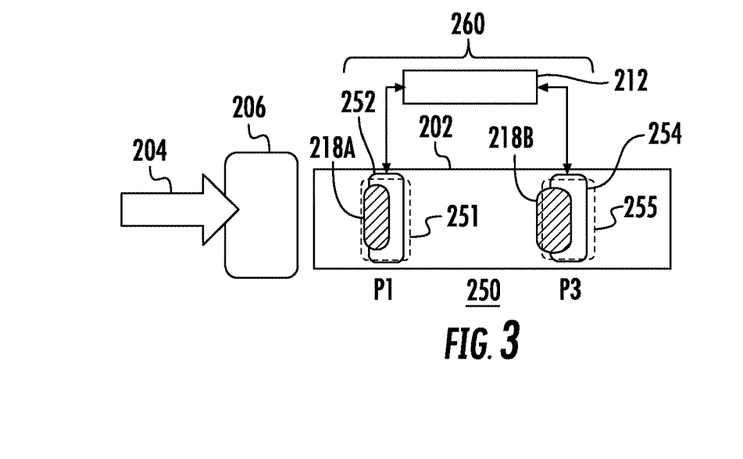
FIG. 3 depicts another exemplary apparatus for measuring beam energy according to embodiments of the disclosure.

FIG. 3 depicts an exemplary apparatus, shown as apparatus 250, according to embodiments of the disclosure. The apparatus 250 may include similar components to apparatus 200, with like components labeled the same. The apparatus 250 may function similarly to the apparatus 200, while differing from the apparatus 200 in that a first beam sensor 252 and second beam sensor 254 of a beam energy measurement apparatus 260 are disposed within the vacuum chamber 202. Similarly to the apparatus 200, the apparatus 250 includes a space 251 defined by the first beam sensor 252, the first beam sensor 252 may generate a first sensor signal to be received by the detection system 212. When the ion beam pulse 218A propagates down the beamline as ion beam pulse 218B and passes by the space 255 defined by the second beam sensor 254, the second beam sensor 254 may generate a second sensor signal to be received by the detection system 212. In some embodiments of the disclosure, the first beam sensor 252 and the second beam sensor 254 may be arranged in the shape of circular cylinders, as a first capacitive pickup and a second capacitive pickup, concentrically disposed around the ion beam pulse 218A and ion beam pulse 218B.

Figures 4A, 4B:
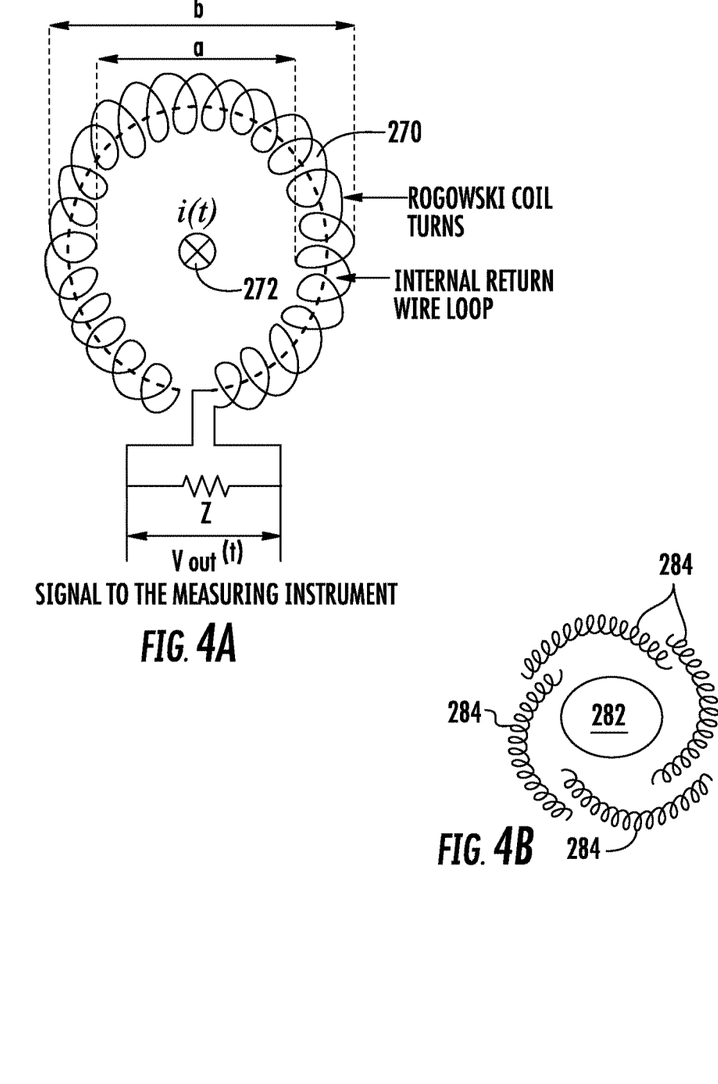
FIG. 4A depicts details of an exemplary induction coil.
FIG. 4B depicts an end view of an exemplary induction coil arrangement.

FIG. 4A depicts details of an exemplary beam sensor, shown as induction coil 270. In this example, the induction coil 270 is arranged as a Rogowski coil. More particularly, a Rogowski coil is a magnetic pickup coil employing the time variation of the passing ion beam to produce a time varying magnetic field, and thus, induce an electromotive force in the coil. This force can then be read out as a voltage (acting as a sensor voltage signal), which voltage is proportional to the time rate of change of the current of the ion beam 272 passing through the coil. As shown in FIG. 4A, the design of a Rogowski coil includes a collection of turns arranged in a toroidal shape, having a return of the circuit passing through the center of the turns. The voltage generated by a Rogowski coil depends on the cross sectional area of the turns, the number of turns, the total length of the coil, and the time rate of change of the current passing through a space defined by the Rogowski coil. More particularly, $$V = \frac{AN\mu_0\mu_r}{l}\frac{dI}{dt}$$

Where: V is the voltage out of Rogowski coil, A is the cross sectional area of the turns, N is the number of turns, $\mu_0$ is the magnetic permeability of free space, $\mu_r$ is the relative permeability of the material inside the turns, l is the total circumferential length of the coil and dI/dt is the time rate of change of the current passing through the coil.

In accordance with various embodiments, a Rogowski coil may be arranged to generate an output voltage sufficient to be reasonably detectable by commercially available electronics. For example, a Rogowski coil may be designed to generate an output voltage of 10 μV or greater, or 100 μV or greater.

As an example: a 26 awg wire may be chosen (~0.5 mm dia, with insulation), where the Rogowski coil has a 100 mm Major diameter, a 10 mm minor diameter, resulting in approximately 6300 turns. Another assumption may be where air core turns, or PTFE (Teflon) or other material having a $\mu_r$ equal to 1 are employed. At 27 MHz frequency for a buncher or acceleration stage of a LINAC, ion pulses generated have a period of 37 ns, and have a duration of >50% of the period or >18.5 ns. Under this scenario, a 200 μA ion beam will generate a output voltage of approximately 127 μV, which signal may be readily detected by present day electronics. In various non-limiting embodiments, the major diameter of a Rogowski coil ma range between 1 cm and 30 cm, and the minor diameter between 2 mm and 50 mm.

Notably, in various non-limiting embodiments, a Rogowski coil doesn't need to be round, while a coil of any shape arranged in proximity to an ion beam may be used. According to some embodiments, a Rogowski coil assembly may be arranged in multiple different sections, where the relative strength of the signals from different sections may be used provide beam position information. In the case of a segmented Rogowski coil set, the relative strength of the signals will depend on the proximity of the beam to the coil, due to there being more magnetic flux through some coils versus others. For example, in an embodiment where the Rogowski coil is made of 4 sections, 2 on top and bottom and 2, arranged side to side, the relative position of the ion beam along a "vertical axis" and the relative position of the ion beam along a "horizontal axis" may be determined by the relative strength of the signals in opposing coils. Taking all the proximity data together from all the coils will allow for precise and accurate beam position measurement. Further notably, for a given wire diameter, the number of turns (N) scales with the major diameter of the coil (l/p), and thus the signal output is independent of the size of the Rogowski coil.

FIG. 4B depicts an end view of an induction coil arrangement 280, arranged as a segmented Rogowski coil, divided into four different coils, shown as coils 284, disposed around an ion beam, having the form of an ion beam pulse 282. In the example of FIG. 4B, the different coils may be arranged at the same axial or longitudinal location along a beamline, while also arranged to provide overall symmetry about a nominal beam path, which symmetry aids in simplifying the interpretation of the different signals generated by the induction coil arrangement 280. In the example of FIG. 4B, each individual coil overlaps adjacent coils, and is arranged with one end closer to the nominal beam path than the other end.

Figure 5A:
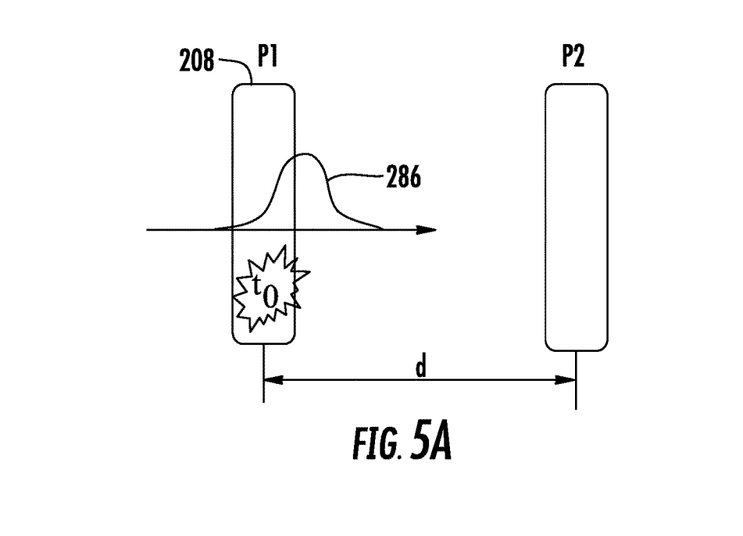
FIG. 5A depicts a first instance during beam energy measurement using an exemplary apparatus according to one embodiment.
Figure 5B:
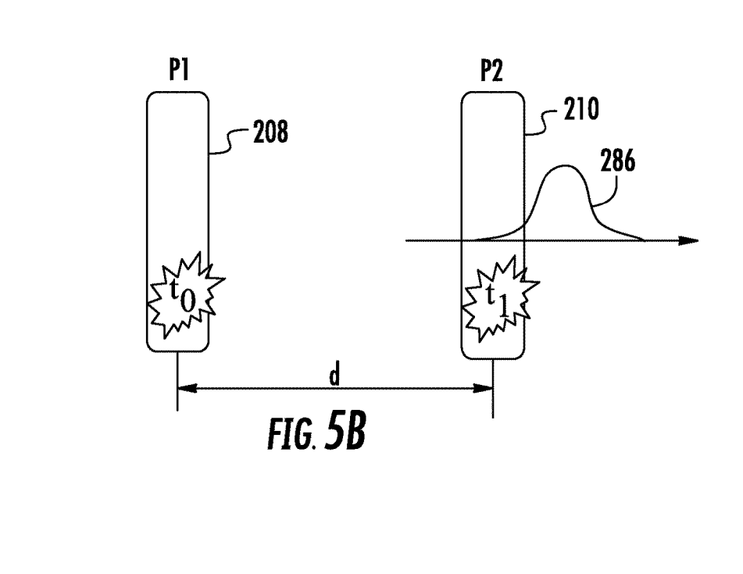
FIG. 5B depicts a second instance during beam energy measurement, after the first instance of FIG. 5A.

FIG. 5A depicts a first instance during beam energy measurement using an exemplary apparatus according to one embodiment, and FIG. 5B depicts a second instance during beam energy measurement, after the first instance of FIG. 5A. As suggested, the arrangement in FIG. 5A and FIG. 5B shows a first beam sensor 208 and second beam sensor 210. The arrangement of FIG. 5A and FIG. 5B illustrates measurement of beam energy using time-of-flight principle.

Time of flight (ToF) is a known method for measuring the average speed or energy of an ion or particle. In an implementation of this method, the first beam sensor 208 and second beam sensor 210 are arranged a known distance apart, d. As an ion beam pulse 286 passes through the first beam sensor 208, the ion beam pulse 286 induces a perturbation, and a signal is generated. In the present embodiments, this signal is output from the first induction coil to a detection system, which signal may start a clock at a time equals $t_0$. The ion beam pulse 286 will continue down the beamline to the next detector, shown as second beam sensor 210, inducing a second perturbation to generate a second signal, which signal may stop the clock of the detection system at a time equal to $t_1$. The speed of the ion beam pulse 286 is determined by the separation distance, d, divided the difference in times, $\Delta t = t_1 - t_0$. Based upon the mass of the ion beam, the calculated speed can then be directly translated into beam energy, using known relationship between mass, velocity and energy of a particle.

In regard to FIGS. 5A and 5B, and also referring to FIGS. 2 and 3, in some embodiments, a first beam sensor and a second beam sensor may be disposed with respect to one another in a linear fashion, along a linear portion of a beamline, where an ion beam pulse travels along a straight trajectory between the first beam sensor and second beam sensor. In other embodiments, the second beam sensor may be disposed downstream of the first beam sensor where the beamline undergoes a change of direction between the first beam sensor and the second beam sensor. Said differently, the pulsed ion beam changes direction between the first beam sensor and the second beam sensor. In either configuration, beam energy may be measured according to the same general principle of determining speed of a pulsed ion beam by dividing the separation between a first beam sensor and second beam sensor by the time of flight of an ion beam pulse between the first beam sensor and the second beam sensor.

Figure 5C:
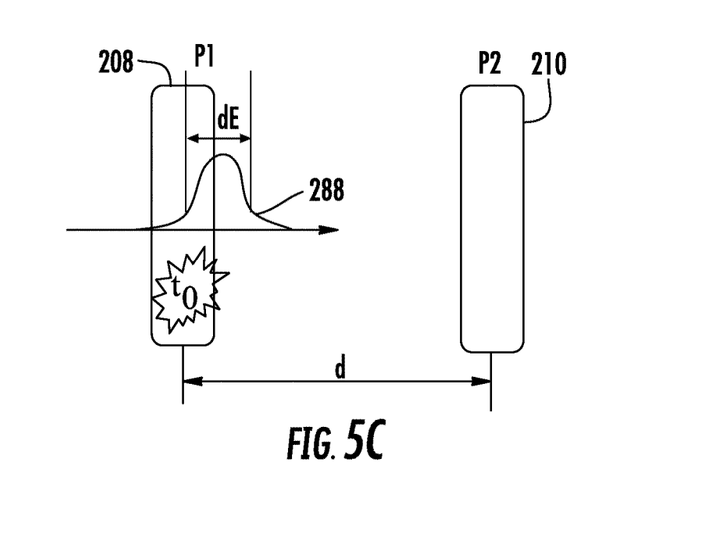
FIG. 5C depicts a first instance during beam pulse profile measurement using an exemplary apparatus according to one embodiment.
Figure 5D:
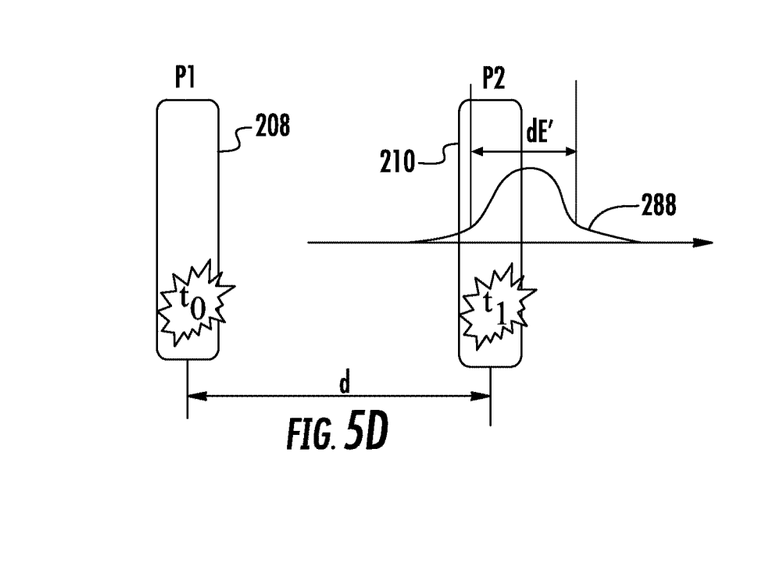
FIG. 5D depicts a second instance during beam pulse profile measurement, after the first instance of FIG. 5C.

FIG. 5C depicts a first instance during beam pulse profile measurement using an exemplary apparatus according to one embodiment, while FIG. 5D depicts a second instance during beam pulse profile measurement, after the first instance of FIG. 5C. In the scenario of FIG. 5C and FIG. 5D, the first beam sensor 208 and the second beam sensor 210 are arranged similarly to the arrangement of FIG. 5A and FIG. 5B. An ion beam pulse 288 is conducted through the first beam sensor 208 at the instance of $t_1$, and conducted through the second beam sensor 210 at the instance of $t_2$. As illustrated, the ion beam pulse 288 may be characterized by a first pulse width dE at instance of $t_0$ and a second pulse width dE' at instance $t_1$. As the ion beam pulse 288 traverses the first induction coil and the second induction coil, the ion beam pulse 288 may generate a concomitant voltage pulse in an induction coil, characterized by a voltage pulse profile, including a voltage pulse width. As such, the detection system may include a routine to determine beam energy spread from analysis of the pulse shape of an ion beam pulse based upon measurement of pulse width of a voltage pulse generated at a first beam sensor 208, second beam sensor 210, or both coils. Thus, the change ion pulse duration or pulse width may be determined as the ion beam pulse propagates down a beamline.

Figure 6:
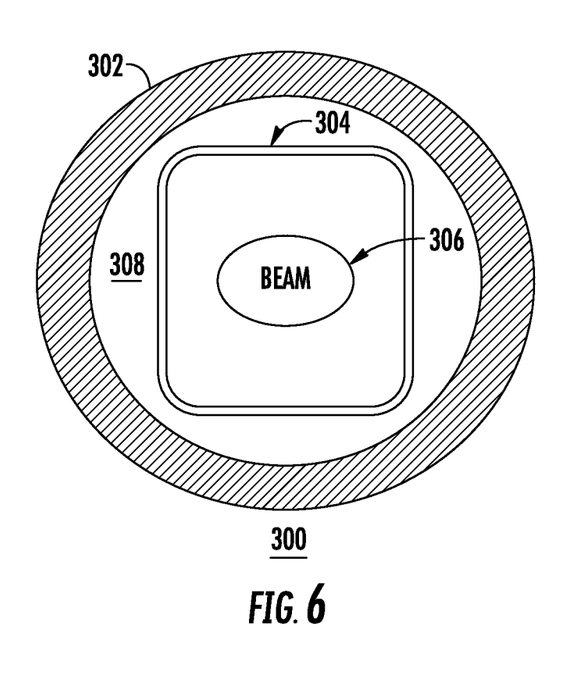
FIG. 6 depicts an end cross-sectional view of an apparatus according to an embodiment of the disclosure.
Figure 7:
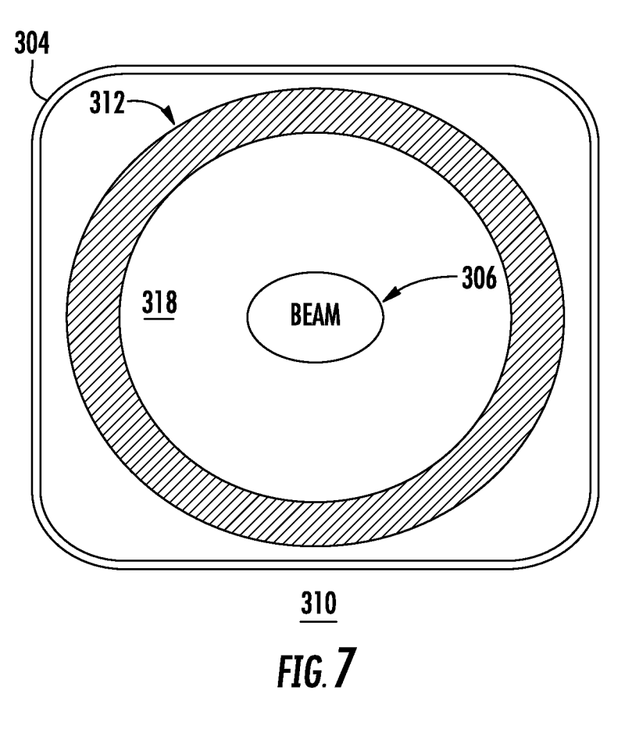
FIG. 7 depicts an end cross-sectional view of another apparatus according to an embodiment of the disclosure.

FIG. 6 depicts an end cross-sectional view of an apparatus 300, according to an embodiment of the disclosure, while FIG. 7 depicts an end cross-sectional view of an apparatus 310 according to another embodiment of the disclosure. The apparatus 300 is characterized by an induction coil 302, disposed outside of a vacuum chamber wall 304. The apparatus 300 may include a second induction coil, disposed downstream of the induction coil 302, in a similar fashion to induction coil 302. When an ion beam 306 or any current passes through the space 308, defined by the induction coil 302, a voltage may be generated, for detection by a detector, such as the aforementioned detection system 212.

For the apparatus 300, the conductivity and magnetic properties of the vacuum chamber wall may affect the measurement of the induction coil 302. In some embodiments, the vacuum chamber wall 304, at least in regions proximate to the induction coil 302, may be formed of an electrical insulator, ideally with a permeability of 1.

The apparatus 310 is characterized by an induction coil 312, disposed inside of a vacuum chamber wall 304. The apparatus 300 may include a second induction coil, disposed downstream of the induction coil 302, in a similar fashion to induction coil 302. When an ion beam 306 or any current passes through the space 318, defined by the induction coil 312, a voltage may be generated, for detection by a detector, such as the aforementioned detection system 212. Having the Rogowski coil arranged very close to the beam path may provide less opportunity for noise pickup, and in some cases may be more desirable. In other cases, it might make signal acquisition or signal transport may be easier when the coils are outside the vacuum chamber. In this embodiment, the conductivity and magnetic properties of the vacuum chamber wall 304 don't affect measurement by the induction coil 312, and thus the vacuum chamber wall 304 proximate the induction coil 312 may be constructed of any suitable material, including electrical conductors.

Figure 8:
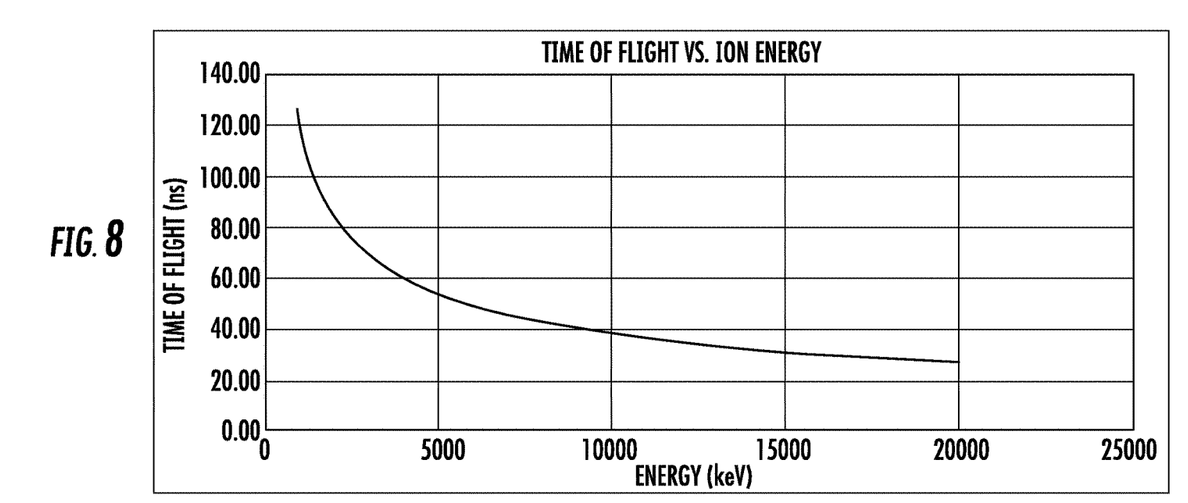
FIG. 8 illustrates an exemplary time of flight curve as a function of ion energy.

In accordance with various embodiments of the disclosure, a set of Rogowski coils may be arranged to detect ion energy for high energy ion beams, such as a pulsed ion beam having an energy in excess of 500 keV, 1 MeV, 2 MeV, 5 MeV, or 10 MeV, as an example. To underscore the dimensions and spacings of a set of Rogowski coils to measure such energies, FIG. 8 illustrates the time of flight as a function of the ion energy. In particular, FIG. 8 presents a curve showing plot of the time of flight for an ion conducted between two detectors spaced 0.5 m apart, as a function of ion energy. In other words, the time of flight is the time elapsed between when an ion passes a first coil to the time the ion passes the second coil, 0.5 m downstream. For example: at 10 MeV, the signals generated by such coils would arrive at a detector system approximately 38 ns apart. As expected, the time of flight decreases gets as a function of ion energy in a manner approximately described by $1/E_{ion}^{1/2}$. The resolution of signals received at 38 ns intervals is readily achieved by many present day electronics.

Figure 9:
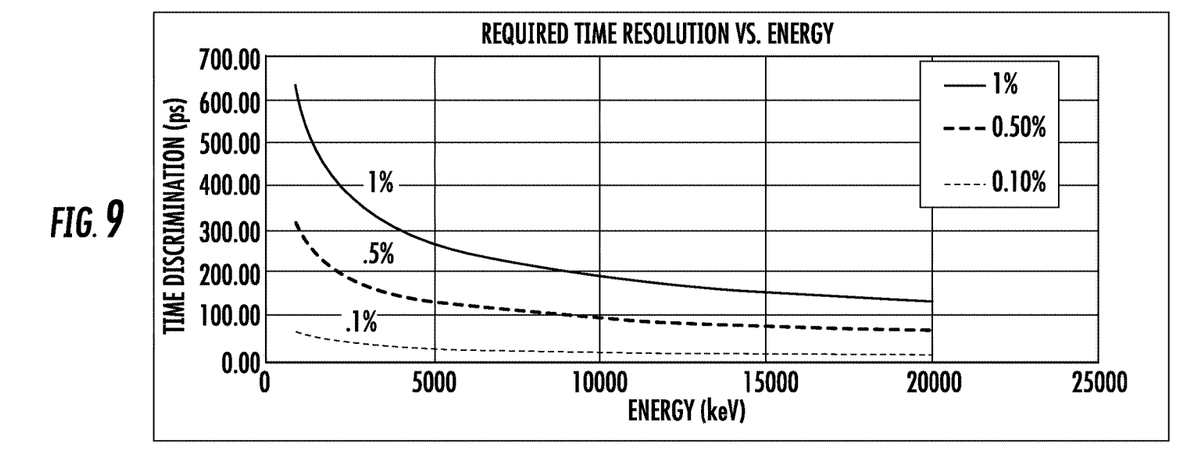
FIG. 9 exemplary curves illustrating the required time resolution of a detector to generate a given beam energy resolution as a function of ion energy for three different fractional energy resolution values, shown as percentages.

Another useful feature provided by the present embodiments is the ability to detect ion energy at a given energy resolution. FIG. 9 presents exemplary curves illustrating the required time resolution of a detector to generate a given beam energy resolution as a function of ion energy for three different fractional energy resolution values, shown as percentages. More particularly, the various curves of FIG. 9 represent the required time discrimination as a function of energy, for energy resolutions of 1%, 0.5% and 0.1%, again shown as a function of increasing ion energy. For example, given a separation of 0.5 m between two different induction coils, for an ion beam having an energy of approximately 10 MeV, in order to measure ion energy to within 0.5% accuracy, one would need to be able to tell the difference between a ~38 ns signal (see FIG. 8) and a ~38.1 ns signal. This 0.5% energy resolution corresponds to the middle curve of FIG. 9, and yields a value of ~100 ps for 10 MeV ion energy, or 0.1 ns., which interval may be resolvable by commercially available electronics.

Figure 10:
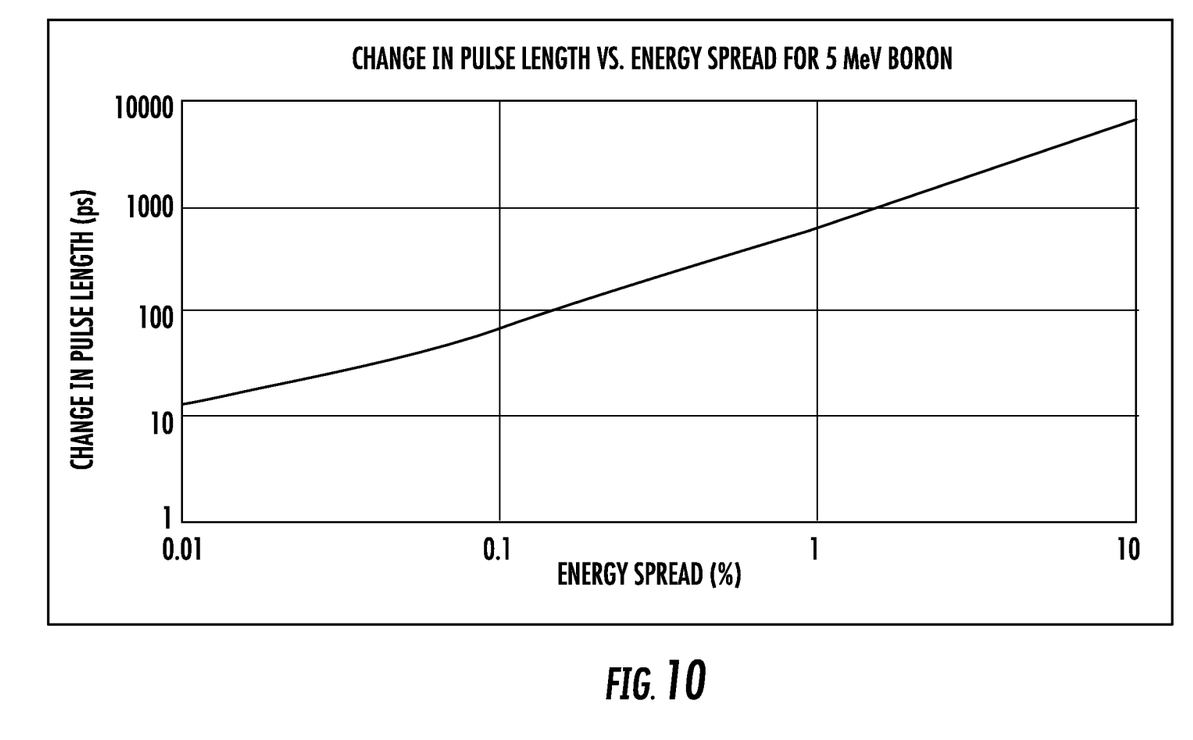
FIG. 10 illustrates a pulse length for 5 MeV pulsed boron ion beam as a function of energy spread of the pulse.

In accordance with various embodiments, analysis and comparison of the shapes of two different pulses may be performed, such as for the ion beam pulse 282, when detected by the first beam sensor 208 and second induction coil, respectively. This analysis will allow for quantification of the energy spread taking place as the ion beam pulse 282 propagates down a beamline. Assuming a pair of induction coils is separated by 50 cm, for an ion beam pulse having energy of 5 MeV+/−1% and an initial pulse length of 18.52 ns (at the first beam sensor 208, for instance), the pulse length may be expected to grow to approximately 19.2 ns after completing travel over the 50 cm distance to the second beam sensor 210. For comparison, an energy spread of +/−0.1% would imply the pulse length increase from 18.52 ns to just 18.6 ns for the same distance traveled. FIG. 10 is a plot of the change in the pulse length as a function of the energy spread, for 5 MeV Boron and induction coil separation of 50 cm. Thus, in accordance with an embodiment of the disclosure, if the pulse length of a 5 MeV boron in beam pulse is observed to increase by approximately 700 ps, the energy spread of the boron ion beam pulse may be determined to be 1%.

Figure 11:
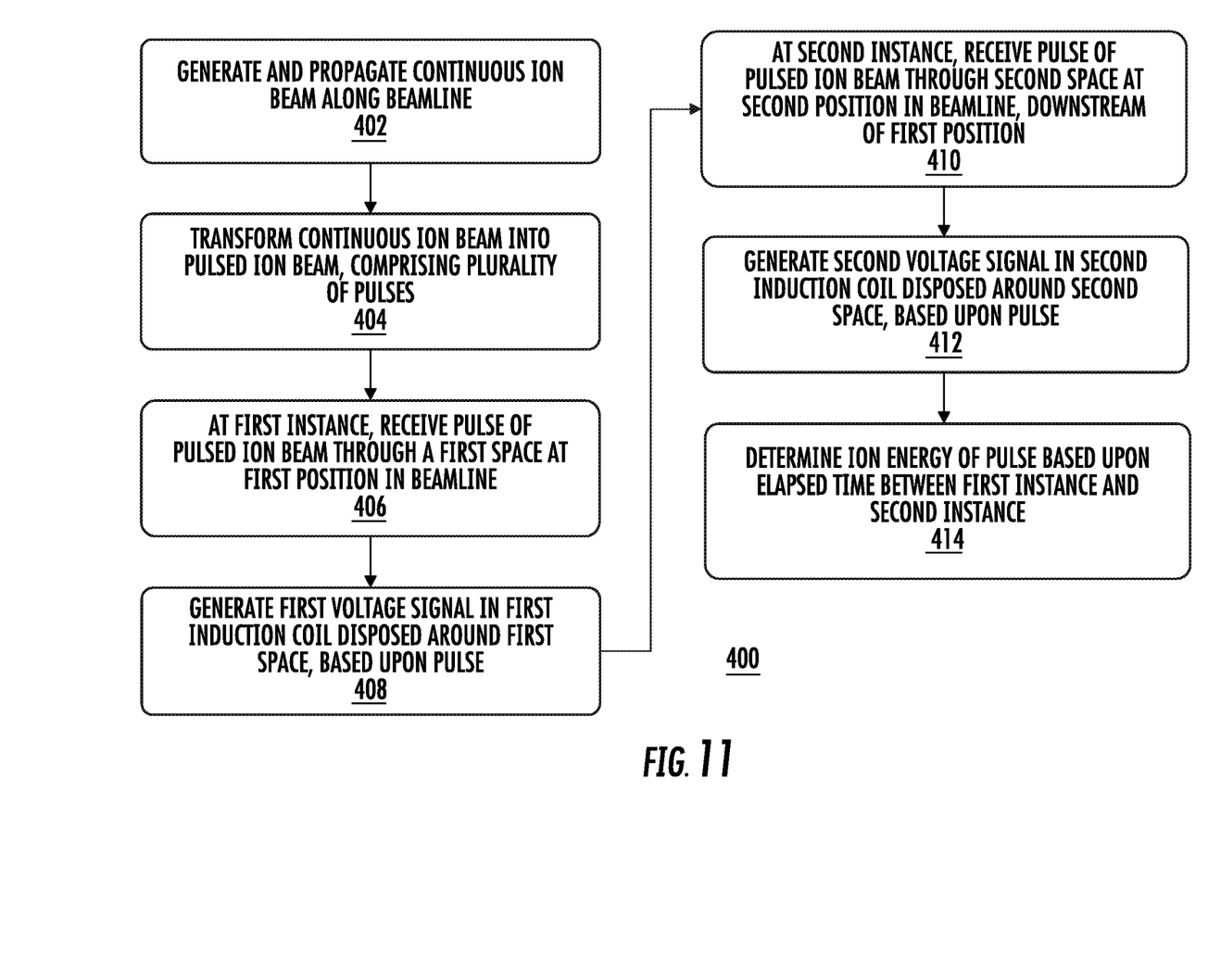
FIG. 11 shows an exemplary process flow according to some embodiments of the disclosure.

FIG. 11 depicts an exemplary process flow 400 according to some embodiments of the disclosure. At block 402 an ion beam is generated as a continuous ion beam, and propagated down a beamline. As such, the ion beam may exhibit an ion energy in the range of several keV up to 100 keV.

At block 404, the continuous ion beam is transformed into a pulsed ion beam. The continuous ion beam may be processed by a buncher, for example, to generate a pulsed ion beam with a pulse frequency in the range of 13 MHz to 40 MHz, corresponding to a pulse period of 25 ns to 75 ns. In some embodiments, the pulsed ion beam may be accelerated through at least one stage of a linear accelerator using and RF voltage. The pulsed ion beam may be accelerated to a target ion energy, such as 500 keV, 1 MeV, 2 MeV, 5 MeV, or other suitable energy.

At block 406, at a first instance, a pulse of the pulsed ion beam is received through a first space at a first position in the beamline.

At block 408, a first voltage signal is generated in a first induction coil disposed around the first space, based upon pulse of the pulsed ion beam. In some embodiments, the first induction coil is a Rogowski coil, configured to generate an output voltage in response to a time-varying current signal passing through the first space. As such, when the pulse of the pulsed ion beam is conducted through the first space, the Rogowski coil will generate a voltage as the positive ion current increase from approximately zero before the pulse arrives in the first space, to a maximum current value, and then decreases.

At block 410, at a second instance, the pulse of the pulsed ion beam is received through a second space at a second position in the beamline, downstream of first position.

At block 412, a second voltage signal is generated in a second induction coil disposed around the second space, based upon pulse of the pulsed ion beam, meaning the same pulse as detected in the first induction coil. The second voltage signal may be generated by a Rogowski coil, similarly to first induction coil.

At block 414, the ion energy of the pulse is determined, based upon the elapsed time between the first instance and the second instance.

In view of the foregoing, at least the following advantages are achieved by the embodiments disclosed herein. A first advantage is realized by a non-perturbing measurement of ion beam energy, in a manner not affecting beam shape, focus, direction, current, or other properties. Another advantage afforded is the ability to measure a beam position in a non-perturbing manner.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
   a first beam sensor, disposed at a first position along a beamline;
   a second beam sensor, disposed at a second position along the beamline, at a predetermined distance, downstream of the first beam sensor; and
   a detection system, coupled to the first beam sensor and to the second beam sensor to receive from a pulsed ion beam a first electrical signal from the first beam sensor and a second electrical signal from the second beam sensor, and compare a timing of the first electrical signal and the second electrical signal,
   wherein the first beam sensor and the second beam sensor comprise a first Rogowski coil and a second Rogowski coil, respectively, wherein the first Rogowski coil and the second Rogowski coil are characterized by a major diameter and a minor diameter, the major diameter ranging between 1 cm and 30 cm, and the minor diameter ranging between 2 mm and 50 mm.

2. The apparatus of claim 1, wherein the first Rogowski coil and the second Rogowski coil are arranged within a vacuum chamber of the beamline.

3. The apparatus of claim 1, wherein the first Rogowski coil and the second Rogowski coil are arranged concentrically around a vacuum chamber of the beamline.

4. The apparatus of claim 1, wherein the first predetermined distance is between 10 cm and 250 cm.

5. The apparatus of claim 1, further comprising a third beam sensor, arranged adjacent a third position, at a predetermined distance, downstream of the second beam sensor, wherein the detection system is coupled to the third beam sensor to receive a third electrical signal.

6. A system, comprising:
   an ion source to generate an ion beam;
   a buncher to receive the ion beam as a continuous beam and output a pulsed ion beam along a beamline, the pulsed ion beam comprising a plurality of pulses; and
   a beam energy measurement apparatus, disposed downstream of the buncher, and comprising:
   a first Rogowski coil, disposed concentrically with respect to the beamline;
   a second Rogowski coil, arranged at a predetermined distance, downstream of the first Rogowski coil, and disposed concentrically with respect to the beamline, wherein the first Rogowski coil and the second Rogowski coil are characterized by a major diameter and a minor diameter, the major diameter ranging between 1 cm and 30 cm, and the minor diameter ranging between 2 mm and 50 mm; and
   a detection system, coupled to the first Rogowski coil and to the second Rogowski coil, to receive from the pulsed ion beam a first electrical signal from the first Rogowski coil and a second electrical signal from the second Rogowski coil and compare a timing of the first electrical signal and the second electrical signal.

7. The system of claim 6, wherein the predetermined distance is between 10 cm and 250 cm.

8. The system of claim 6, further comprising a third Rogowski coil, arranged at a predetermined distance, downstream of the second Rogowski coil, and disposed concentrically with respect to the beamline, wherein the detection system is coupled to the third Rogowski coil to receive a third electrical signal.

9. The system of claim 6, further comprising a linear accelerator, disposed downstream of the buncher, wherein the first Rogowski coil is disposed downstream of the linear accelerator.

10. The system of claim 6, further comprising a third Rogowski coil, arranged at a predetermined distance, downstream of the second Rogowski coil, and disposed concentrically with respect to the beamline, wherein the detection system is coupled to the third Rogowski coil to receive a third electrical signal from the third Rogowski coil.

11. A method, comprising:
receiving a pulse of a pulsed ion beam through a first space at a first position along a beamline at a first instance;
generating a first sensor signal in a first beam sensor, disposed at the first position, based upon the pulse;
receiving the pulse in a second space at a second position along the beamline, disposed downstream of the first position, at a second instance;
generating a second sensor signal in a second beam sensor, disposed at the second position, based upon the pulse;
and
determining an ion energy of the pulse based upon an elapsed time between the first instance and the second instance, wherein the first beam sensor and the second beam sensor comprise a first Rogowski coil and a second Rogowski coil, respectively, wherein the first Rogowski coil and the second Rogowski coil are characterized by a major diameter and a minor diameter, the major diameter ranging between 1 cm and 30 cm, and the minor diameter ranging between 2 mm and 50 mm.

12. The method of claim 11, wherein the first sensor signal and the second sensor signal comprise a first sensor voltage signal and a second sensor voltage signal, where voltage of the first sensor voltage signal is determined by:

$$V = \frac{AN\mu_0\mu_r}{l}\frac{dI}{dt}$$

where V is a voltage of the first voltage signal or the second voltage signal, A is a cross sectional area of turns of the first Rogowski coil or Rogowski induction coil, N is a number of turns of the first Rogowski coil or second Rogowski coil, $\mu_0$ is magnetic permeability of free space, $\mu_r$ is relative permeability of material inside the turns, l is total circumferential length of the first Rogowski coil or second Rogowski coil, and dI/dt is time rate of change of current passing through the first Rogowski coil or the second Rogowski coil.

13. The method of claim 11, wherein the generating the first sensor signal comprises generating a first voltage pulse profile at the first instance,
wherein the generating the second sensor signal comprises generating a second voltage pulse profile at the second instance.

14. The method of claim 13, further comprising determining a change in energy spread of the pulse from the first voltage pulse profile and the second voltage pulse profile.

\* \* \* \* \*